US011245361B1

(12) United States Patent
Tabatabaei et al.

(10) Patent No.: US 11,245,361 B1
(45) Date of Patent: *Feb. 8, 2022

(54) TEMPERATURE-REPORTING OSCILLATOR

(71) Applicant: SiTime Corporation, Santa Clara, CA (US)

(72) Inventors: Sassan Tabatabaei, Sunnyvale, CA (US); Kamran Souri, The Hague (NL); Saleh Heidary Shalmany, Delft (NL); Charles I. Grosjean, Los Gatos, CA (US)

(73) Assignee: SiTime Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/061,413

(22) Filed: Oct. 1, 2020

Related U.S. Application Data

(62) Division of application No. 16/402,161, filed on May 2, 2019, now Pat. No. 10,833,632.

(60) Provisional application No. 62/666,633, filed on May 3, 2018.

(51) Int. Cl.

| | |
|---|---|
| *H03B 5/04* | (2006.01) |
| *H03B 5/30* | (2006.01) |
| *G01K 11/26* | (2006.01) |
| *G01K 7/22* | (2006.01) |
| *H03H 9/02* | (2006.01) |
| *G01K 7/24* | (2006.01) |

(52) U.S. Cl.
CPC ............ *H03B 5/30* (2013.01); *G01K 7/226* (2013.01); *G01K 7/245* (2013.01); *G01K 11/26* (2013.01); *H03B 5/04* (2013.01); *H03H 9/02448* (2013.01)

(58) Field of Classification Search
CPC ........ G01K 7/226; G01K 7/245; G01K 11/26; H03B 5/04; H03B 5/30; H03B 5/32; H03H 3/013; H03H 3/0072; H03H 9/02433; H03H 9/02448; H03J 3/04; H03L 1/02; H03L 1/022; H03L 1/026; H03L 1/028
USPC .................................................. 331/154, 158
See application file for complete search history.

(56) References Cited

U.S. PATENT DOCUMENTS

| | | | |
|---|---|---|---|
| 5,760,656 A | 6/1998 | Sutliff | |
| 5,994,970 A * | 11/1999 | Cole | ........................ H03L 1/026 |
| | | | 331/116 FE |
| 7,876,167 B1 | 1/2011 | McCraith | |
| 7,925,463 B2 | 4/2011 | Brooks | |
| 8,314,662 B2 * | 11/2012 | Isohata | ..................... H03L 1/027 |
| | | | 331/176 |
| 2008/0106348 A1 * | 5/2008 | Routama | ................. H03L 1/025 |
| | | | 331/158 |

(Continued)

OTHER PUBLICATIONS

"Coefficient Corrected Oscillator—CCXO," Vectron white paper, 3 pages, Jul. 2014.

(Continued)

*Primary Examiner* — Levi Gannon

(57) ABSTRACT

In an integrated circuit device having a microelectromechanical-system (MEMS) resonator and a temperature transducer, a clock signal is generated by sensing resonant mechanical motion of the MEMS resonator and a temperature signal indicative of temperature of the MEMS resonator is generated via the temperature transducer. The clock signal and the temperature signal are output from the integrated circuit device concurrently.

25 Claims, 4 Drawing Sheets

(56) References Cited

U.S. PATENT DOCUMENTS

| | | | |
|---|---|---|---|
| 2011/0234325 A1* | 9/2011 | Tanaka | H03L 1/022 |
| | | | 331/68 |
| 2012/0268216 A1* | 10/2012 | Borremans | H03H 9/02448 |
| | | | 331/70 |
| 2013/0313332 A1 | 11/2013 | Ishota | |
| 2016/0277031 A1* | 9/2016 | Yonezawa | H03L 1/028 |
| 2017/0194966 A1 | 7/2017 | Yonezawa | |

OTHER PUBLICATIONS

"MD-203, I2C Interface Oven Controlled Crystal Oscillator," Micosemi Data Sheet, Preleminary version, 8 pages, Jan. 16, 2015.

* cited by examiner

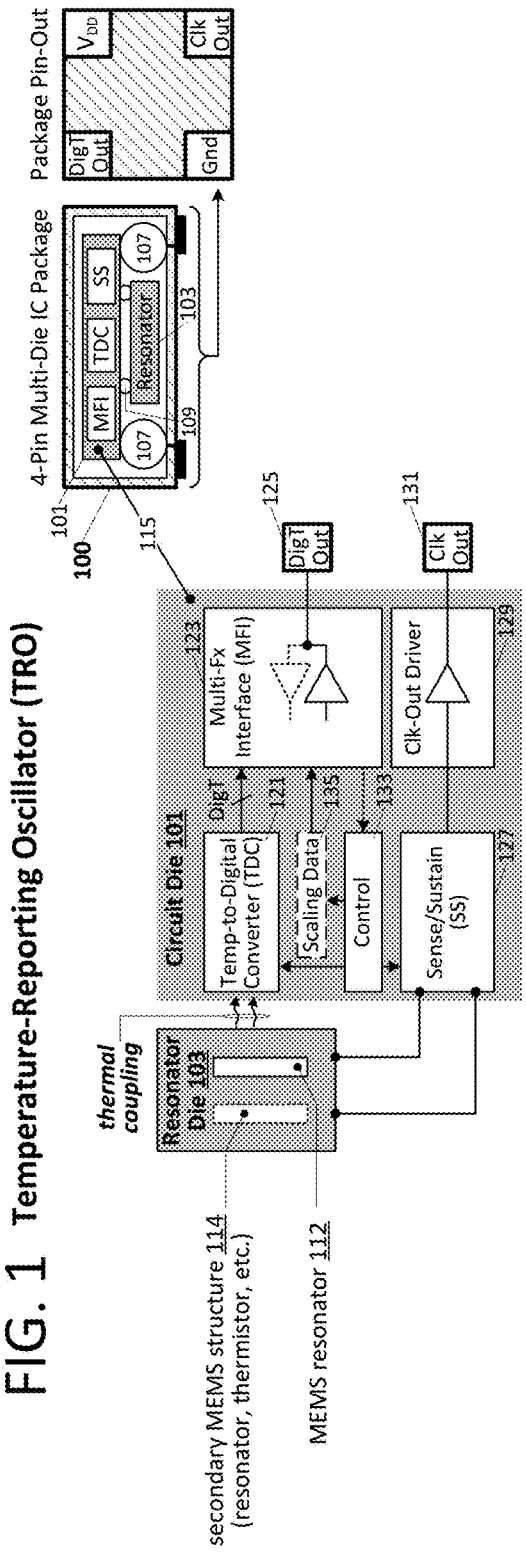
FIG. 1 Temperature-Reporting Oscillator (TRO)
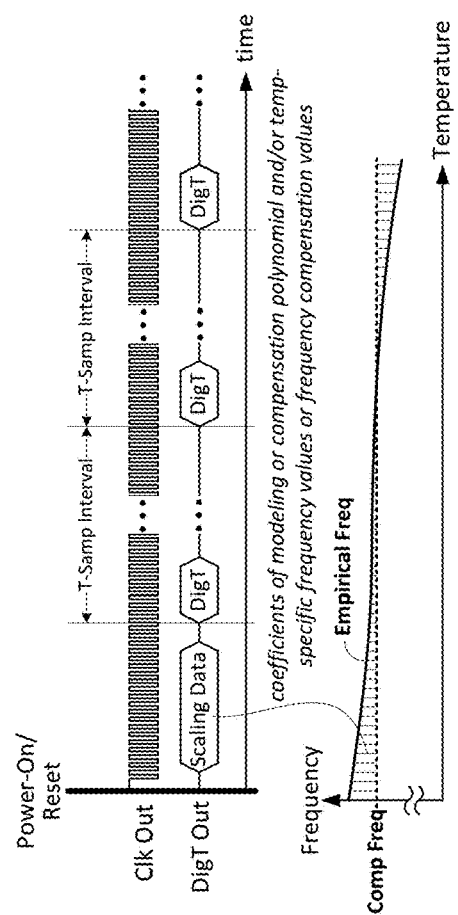
FIG. 4 Temperature Reporting with One-Time/On-Demand Scaling Data Output
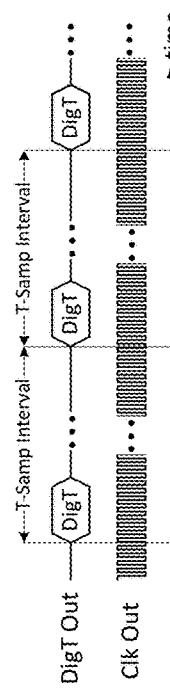
FIG. 2 Periodic Temperature Reporting (programmable sampling interval)
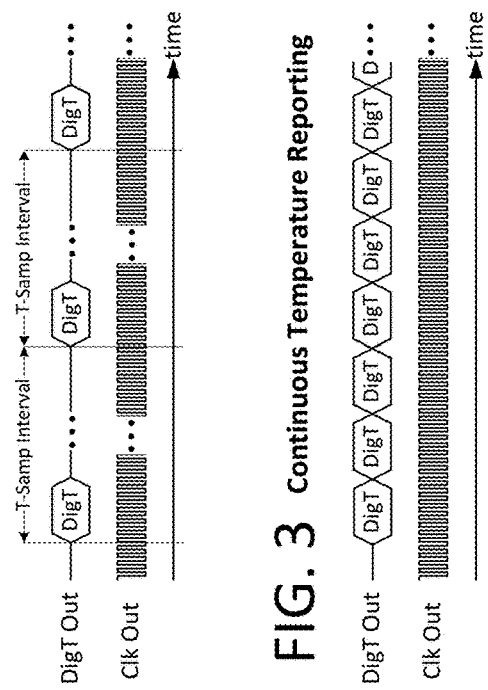
FIG. 3 Continuous Temperature Reporting Point to Multi-Point Current-Mode Signaling Options

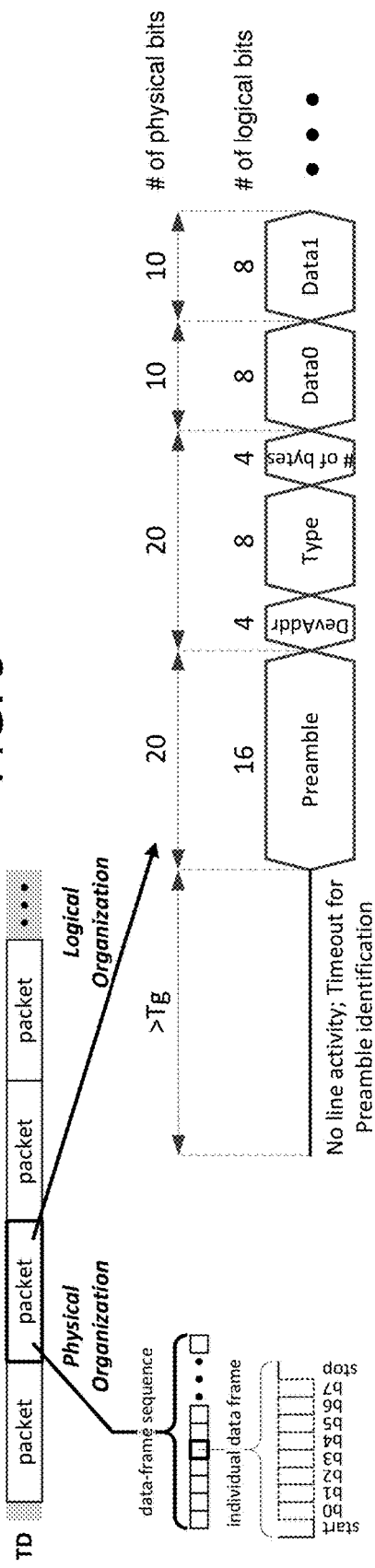
FIG. 9  Packetized communications
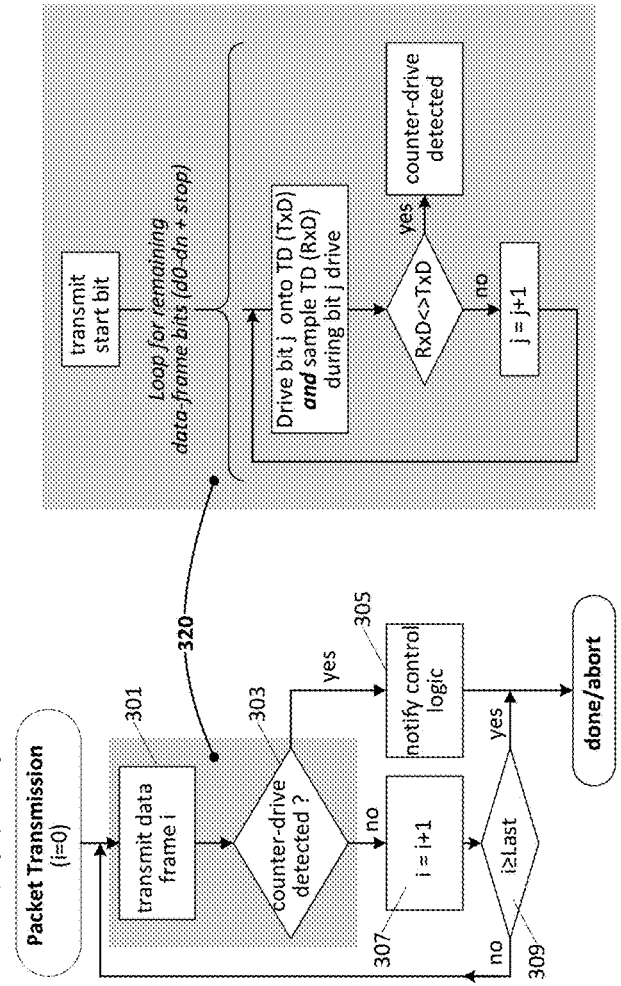
FIG. 10  Packet Transmission/Counter-Drive Detection

TEMPERATURE-REPORTING OSCILLATOR

CROSS-REFERENCE TO RELATED APPLICATIONS

This application is a division of U.S. Utility patent application Ser. No. 16/402,161, filed on May 2, 2019 for "Temperature-Reporting Oscillator," which in turn claims priority to U.S. Provisional Patent Application No. 62/666,633, filed May 3, 2018; each aforementioned application is hereby incorporated by reference.

TECHNICAL FIELD

The disclosure herein relates to high precision timing devices.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a four-pin oscillator IC having a CMOS circuit die, a MEMS resonator die, and respective clock and digital temperature output pins;

FIGS. 2 and 3 illustrate alternative temperature reporting options that may be implemented within the oscillator IC of FIG. 1;

FIG. 4 illustrates exemplary output waveforms from an oscillator IC embodiment that transmits both scaling data and digital temperature data via the digital temperature output;

FIG. 9 illustrates an exemplary packetized data protocol that may be used to communicate data in either direction over the temperature data line; and FIG. 10 illustrates an exemplary counter-drive detection protocol that may be implemented within an oscillator IC in the context of a packetized communication stream.

DETAILED DESCRIPTION

Figure 5:
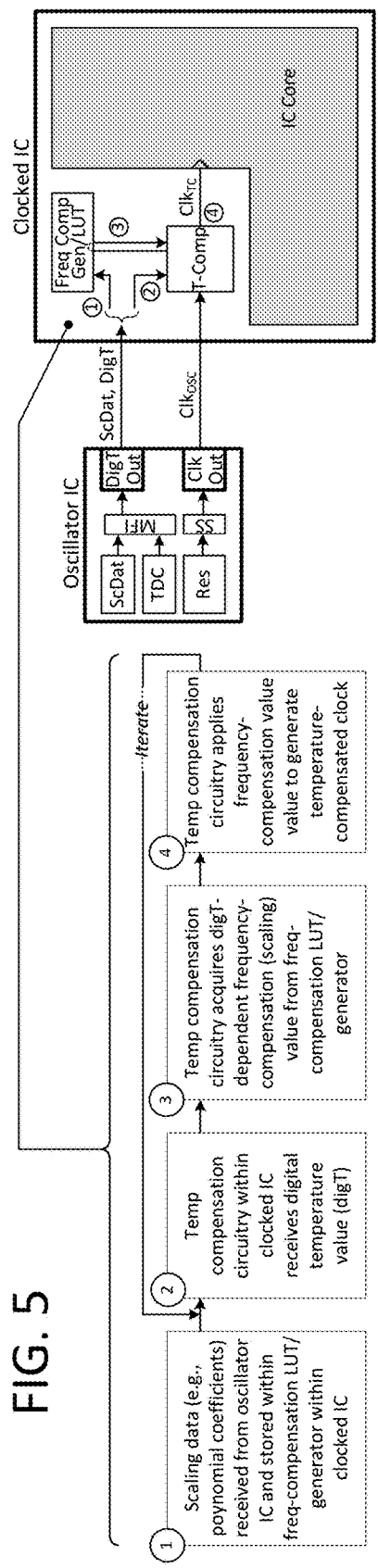
FIG. 5 illustrates an exemplary system that includes the oscillator IC of FIG. 1 and a clocked IC.

In various embodiments disclosed herein, a MEMS (microelectromechanical system) resonator and temperature transducer—generally a temperature-to-digital converter (TDC), though an analog temperature transducer may be alternatively or additionally implemented—are integrated within a small form-factor integrated circuit (IC) package that outputs both a timing signal according to mechanical vibration of the MEMS resonator and a measure of resonator temperature. The IC package, referred to herein as an "oscillator IC," may additionally output scaling data indicative of temperature-dependent frequency offset between the output timing signal and a nominally ideal timing signal over an operating temperature range of the oscillator IC. In a number of embodiments, for example, the IC package outputs—at predetermined time(s) and/or in response to externally sourced request signal(s)—one or more coefficients of a polynomial expression of frequency (or frequency correction) as a function of temperature, thus enabling an external recipient of the scaling data and temperature output to derive a temperature-specific frequency-compensation value and to apply that derived value to the output timing signal output to yield a temperature-compensated timing signal that matches the nominal ideal (e.g., temperature independent timing signal, or timing signal having a predetermined temperature dependence). In the case of a frequency-modeling polynomial, for example, the recipient of the scaling data and temperature output may determine the "modeled" resonator frequency based on the reported temperature (i.e., calculating the polynomial result based on the reported temperature and the supplied polynomial coefficients), then generate and apply a compensation value based on a difference between the modeled frequency and the ideal or target frequency. Alternatively, if the polynomial expresses the frequency correction relative to a given target or ideal frequency (e.g., stable/constant/uniform frequency over operating temperature range, linear frequency change over operating temperature range, etc.), a frequency compensation value may be calculated directly from the polynomial and reported temperature and then applied to yield a temperature-compensated frequency output. In other embodiments, the IC package may output, as the scaling data, frequency compensation values corresponding to frequency offsets between the output timing signal and nominally ideal timing signal at respective temperatures (i.e., compensation values that may be looked up or otherwise selected using the temperature output from the oscillator IC and then applied to the output timing signal to yield a temperature-compensated timing signal). In yet other embodiments, the oscillator IC implements a single-pin (single-node) signaling interface for both temperature signal transmission and control/request signal reception—a solution that enables oscillator IC implementation in an exceedingly compact (e.g., chip-scale) four-pin form factor having a pair of power pins (e.g., VDD and ground), a timing signal output pin and the temperature output pin. In yet other embodiments, the oscillator IC transmits temperature data (and optional scaling data) using a current mode driver that imparts no or negligible voltage transition on the output signaling line and thus eliminates or substantially reduces voltage switching noise that may otherwise couple to sensitive timing generation circuitry. These and other features and embodiments are disclosed in further detail below.

FIG. 1 illustrates an embodiment of a four-pin oscillator IC 100 having a CMOS (complementary metal oxide semiconductor) circuit die 101, a MEMS resonator die 103 and respective clock and digital temperature output pins ("Clk Out" and "DigT Out"). Power and ground pins ("$V_{DD}$" and "Gnd") make up the remaining two of the four total pins exposed at the package exterior.

In the depicted implementation, MEMS resonator die 103 includes a resonant MEMS structure 112 (MEMS resonator) and optional secondary MEMS element 114 and is mounted to the circuit die 101 in a flip-chip configuration, disposed in a pocket between CMOS contact balls 107—an arrangement that yields a low profile (low-height) IC package and also enables tight thermal coupling between the resonator and CMOS dies. In particular, die-to-die interconnect balls (or bumps) 109 provide an extremely low-thermal-resistance path that may be supplemented by a thermally conductive dielectric underfill material (e.g., epoxy containing boron nitride or other thermal conductive dielectric) disposed in the region/space between the two dies. Moreover, a temperature-to-digital converter (TDC) circuit—a constituent of CMOS circuit die 101 along with a sense/sustain circuit (SS), multi-function interface (MFI) and clock-output driver—may be strategically located within the CMOS die to achieve an extremely short thermal conduction path with respect to the MEMS resonator die and thus with respect to the resonating member/structure itself. In a number of embodiments, for example, the conversion bandwidth of the TDC (i.e., rate at which the TDC is able to produce digital temperature values) and tight thermal coupling between the TDC and resonating member (the "resonator") within the MEMS resonator die permit accurate tracking of resonator temperature even through the rapid temperature ramp that occurs at device power-up/wake-up (e.g., temperature ramp as rapid as 1° C./second, 2° C./second, 5° C./second or even 10° C./second, though faster or slower ramps may be accommodated).

While a TDC and digital-temperature output are shown in FIG. 1 and generally discussed with respect to various embodiments herein, in all cases, an analog temperature signal may be generated and output (in addition to or instead of the digital temperature output) in combination with scaling data or otherwise. Also, temperature sensing element (s) and/or temperature data generator (or transducer, etc.) may be implemented within resonator die 103, circuit die 101 or split between those two dies. In a number of embodiments, for example, one or more additional MEMS elements 114 are implemented within resonator die 103 to provide temperature-sense data; an arrangement that provides an exceedingly tight thermal coupling between the oscillator-integrated resonator and the temperature-sensing element. In a specific embodiment, a MEMS thermistor is implemented within resonator die 103 (together with and proximal to MEMS resonator 112 as shown by MEMS element 114) to serve as a temperature signal transducer (ohmic resistance of thermistor changes with temperature, yielding an analog temperature signal). In another embodiment, MEMS element 114 is a second MEMS resonator implemented within resonator die 103 in proximity to the first (clock-out generating) MEMS resonator 112, the first and second resonators having different temperature-dependent frequency profiles such that a difference between the resonator frequencies may be used to precisely determine temperature at any given time. In yet other embodiments, non-MEMS reference elements and temperature-sensing circuits (or circuit elements) may be implemented in the resonator die to serve, in whole or part, as the TDC or analog temperature signal generator (with complementary circuitry implemented within the circuit die as necessary to complete the TDC or analog temperature signal generator in all embodiments).

Referring to the detail view (115) of circuit die 101, the TDC circuit (121) outputs a sequence of digitized/digital temperature values (i.e., measurements, estimations, approximations, representations etc. of resonator temperature shown as "DigT") to the multi-function interface (MFI, 123) which, in turn, transmits those digital temperature values to a destination IC via digital temperature output pin 125 ("DigT Out") and a temperature data signaling link (not shown in FIG. 1) coupled between the oscillator IC and one or more destination ICs. In a number of embodiments, multi-function interface 123 includes a signal receiver— hence the multi-functionality of the interface—to receive externally sourced signals via temperature output pin 125, including requests for circuit die 101 to at least temporarily cease signal transmission and yield exclusive control of the temperature data line to the link-requesting IC.

Continuing with detail view 115, circuit die 101 also includes the aforementioned sense/sustain circuit ("SS", 127)—circuitry that outputs a drive signal to resonator die 103 to actuate resonant mechanical motion of the resonator therein (e.g., electrostatically actuating the resonator through a capacitive coupling, piezoelectrically actuating the resonator via a piezoelectric material that forms part of or is in contact with the resonating member, etc.) and that also includes circuitry to sense a resonator output signal (again, capacitively, piezoelectrically, etc.), delivering an extremely stable and accurate timing/clock signal to clock output driver 129. Clock output driver 129, in turn, outputs the clock signal (and/or a frequency-divided version thereof) to a destination IC referred to herein as the "clocked IC" via clock-out pin 131 and a chip-to-chip clock signaling link. In various embodiments herein, the clocked IC is depicted and described as being the destination for both the clock output and the digital temperature output, and also the source of possible request/control signals to be received within the oscillator IC via the DigT Out pin and multi-function interface. In all cases, the clock and digital temperature outputs may be destined for distinct/respective ICs (e.g., to different dies, different multi-die packages, etc.) and yet other ICs may source request/control signals. Moreover, any output or signal link depicted as extending point-to-point between two ICs (e.g., oscillator IC and clocked IC) may instead be a multi-drop link coupled between more than two ICs in a one-to-many or many-to-many configuration.

Still referring to FIG. 1, a control circuit 133 within circuit die 101 provides control signals (e.g., enable signals, calibration values, configuration values, read/write/address signals, etc.) to the TDC and sense/sustain circuits and also to an optional scaling data memory 135. In one embodiment, control circuit 133 includes a production-time-programmable nonvolatile storage circuit to store empirically and/or analytically determined calibration values (e.g., bias voltage control values that may be applied within sense/sustain circuit to adjust the resonator bias point and thus trim the frequency output, temperature calibration values to be applied within the TDC circuit, etc.), as well as various optional configuration values (e.g., TDC output rate and/or resolution, clock output frequency, particularly where a clock frequency divider having a programmable divisor is provided within or in association with clock output driver 129) according to application requirements. Where multi-function interface 123 supports receipt of run-time control/configuration signals, control circuit 133 may also provide for run-time loaded calibration values, either within the nonvolatile configuration circuit or a non-persistent storage (e.g., static or dynamic random access memory) that is to be re-loaded at each power up.

As discussed briefly above, frequency scaling data, if provided, may be stored within scaling data store 135 in any or all of multiple forms, including coefficients of a temperature-domain frequency correction polynomial (e.g., coefficients of a polynomial expression of any practicable order that enables derivation of a frequency correction value at given temperature setpoint within an operational range of interest (e.g., over a 100° C. range)), coefficients of a temperature-domain frequency modeling polynomial (e.g., coefficients of a polynomial that models the temperature-dependent frequency of the resonant MEMS structure and from which a frequency correction value may be derived given a target frequency-temperature profile), an array of frequency correction values corresponding to respective temperatures (e.g., temperature-indexed frequency-correction lookup) or any other data that describes or characterizes temperature dependence of the resonator output frequency (and thus the oscillator die clock output) over a temperature range of interest. In the embodiment of FIG. 1, the control circuit issues read/write/address signals to the scaling data store to enable the data therein to be read out and transmitted to a clocked IC via the multi-function interface (and DigT output pin). Where the multi-function interface provides for control/calibration data receipt, the scaling data store may be loaded post-production, thus permitting temperature/frequency characterizing data to be obtained with respect to a complete and packaged oscillator IC (i.e., all process steps completed so that any possible process-related temperature-dependence factors are accounted for) and then recorded within the scaling data store. Note that scaling data store 135 may also serve as the oscillator configuration data storage (i.e., so that no separate nonvolatile storage is required for the programmable configuration data discussed above) and/or may be implemented by a separate IC (e.g., a small form-factor Flash memory IC) integrated within multi-die IC package 100 and coupled to circuit die 101.

Despite emphasis on reduced pin count and package form-factor, the IC package of FIG. 1 may have more than four pins in alternative embodiments. For example, instead of multiplexing temperature-data output and incoming control signals at temperature-output pin 125, one or more dedicated output pins may be provided (e.g., one pin for scaling data output, another pin for temperature output, or a single output pin onto which scaling data and temperature data are multiplexed) and one or more dedicated control pins may be provided. More generally, any practicable input/output signaling arrangement (dedicated pins and/or multi-plexed pins) may be implemented as necessary to convey control signals, status signals, temperature data, temperature-scaling data, one or more replica clock signals (with or without phase-shift), one or more frequency-divided and/or frequency-multiplied clock signals (i.e., copies of the output clock and/or frequency-divided/frequency-multiplied versions thereof), etc., with corresponding pin count. (Note that the term "pin" is used in a broad sense herein to encompass any form of electrical contact at the exterior surface of an integrated circuit die or integrated circuit package, including without limitation a pad, electrode, terminal or any other practicable electrical contact structure.) Moreover, temperature data and/or scaling data may be transmitted wirelessly by radio-frequency (RF) transmission circuitry implemented within circuit die 101 or another component integrated within multi-die IC package 100 (e.g., RF transmission according to any of various low-power wireless transmission protocols such as Bluetooth-Low Energy (BTLE), Near-Field communication (NFC), etc.). Similarly, control information may be received wirelessly via RF signal reception circuitry within circuit die 101 or other component of IC package 100 (including wireless reception of programmatic information during mission-mode operation and/or production-time or run-time/mission-mode loading of resonator temperature-dependency data into scaling data store 135 or other nonvolatile storage).

FIGS. 2 and 3 illustrate alternative temperature reporting options that may be implemented within the oscillator IC of FIG. 1. In the periodic temperature reporting configuration shown in FIG. 2, the oscillator IC periodically transmits a digital temperature value ("DigT") as a burst of constituent symbols (e.g., bits) via the temperature output pin, idling the output driver within the multi-function interface (i.e., element MFI 123 of FIG. 1) following each output burst and thus for a least a portion of the period (i.e., the temperature sampling interval) between successive output bursts. In one embodiment, for example, the DigT output driver idles by driving a predetermined voltage level (e.g., high, low or a midrange "idle" level) at the DigT pin, and in other embodiments, the output driver idles by transitioning to a high-impedance state, thus permitting the temperature data line to be pulled to a high, low or mid-range potential signaling level and also permitting time-multiplexed access to the temperature data line (e.g., shortly after receiving or detecting transmission of a temperature burst (temperature value) and for a predetermined time according to the burst duration and temperature sampling interval, another IC may drive the temperature data line without contention from the oscillator IC.

In the continuous temperature reporting configuration shown in FIG. 3, the oscillator IC transmits digital temperature bursts without intervening idle intervals (i.e., bursts transmitted back to back). As discussed below, even in this continuous-transmission configuration, request/control information may be conveyed to the oscillator IC over the temperature data line—either through counter-drive signaling or via modal multiplexing of the data line, for example. Also, in a number of embodiments, the oscillator IC may be production-time or run-time programmed to operate in either periodic or continuous temperature reporting modes, with the temperature-sampling interval itself also being programmable. In both the FIG. 2 and FIG. 3 embodiments and those discussed below, the digital temperature output burst may instead be an analog temperature signal (voltage or current)—output at distinct intervals (as in the digital counterpart shown in FIG. 2) or continuously.

FIG. 4 illustrates exemplary output waveforms from an oscillator IC embodiment that transmits both scaling data and digital temperature data via the digital temperature output (DigT Out), time-multiplexing those transmissions. In the auto-report embodiment shown, scaling data is output autonomously (automatically, without external trigger other than power-up) at least once following IC power-up—for example, as the initial transmission following power up (the depicted approach) or after a predetermined number of digital temperature transmissions and/or transmissions of other information. After transmitting the scaling data, the oscillator IC commences periodic or continuous digital temperature reporting. As discussed below, where the multi-function interface provides for control signal/control information receipt, the oscillator IC may, after an initial autonomous scaling data output, re-transmit the scaling data in response to a request conveyed via the temperature data line, for example, temporarily ceasing temperature reporting to re-transmit the scaling data or transmitting the scaling data within one or more idle intervals between periodically reported temperature data. In yet other embodiments, the oscillator IC may issue no autonomous scaling data transmissions and instead transmit scaling data only in response to detection of a host signal/request conveyed via the temperature data line. In either case, the scaling data may include polynomial coefficients or temperature-specific frequency offset data as discussed above.

FIG. 5 illustrates an exemplary system that includes the oscillator IC of FIG. 1 and a clocked IC, showing an exemplary sequence of operations carried out within the clocked IC to yield a temperature-compensated clock signal ($Clk_{Tc}$) for delivery to core circuitry therein ("IC Core"). Starting at (1), the clocked IC receives scaling data (e.g., polynomial coefficients or temperature-indexed frequency data or frequency offset data) via the temperature data line (i.e., transmitted by the oscillator IC via DigT Out) and stores the scaling data within a frequency-compensation circuit—for example, a frequency-offset generating circuit that algorithmically or heuristically generates the frequency offset in the case of polynomial coefficients, or a lookup table in the case of temperature-indexed frequency offset values. At (2), temperature compensation circuitry within the clocked IC receives one or more temperature compensation values as well as temperature data value from the oscillator IC via the temperature data line, applying those values (e.g., after filtering) to the frequency-compensation circuit at (3) to obtain therefrom a temperature-dependent frequency compensation value. At (4), the temperature compensation circuitry applies the frequency-compensation value to generate the temperature-compensated clock signal, thereby delivering a substantially temperature-insensitive clock signal to the IC core.

Still referring to FIG. 5, in a number of embodiments, the temperature data reported by oscillator IC is used exclusively for frequency compensation such that any nonlinearity in the transduced temperature signal may be subsumed into a nonlinear frequency compensation profile (i.e., doesn't matter that temperature data output is nonlinear with respect to linear temperature rise or fall). In other embodiments, particularly where the temperature data may be applied elsewhere or for other purposes within the clocked IC (and even if the temperature data is applied exclusively for clock frequency compensation within the clocked IC), the oscillator IC may include, as part of the analog temperature signal generator or temperature-to-digital converter or as a post-processing element thereof, circuitry to linearize or otherwise process the temperature data signal and thereby yield, for example a temperature data signal according to an absolute temperature scale (Kelvin) or having a gradient according to an absolute-gradient scale (Kelvin, Celsius, Fahrenheit, etc.) or logarithmic (or other useful analytical-expression) scale, with numeric temperature values according to any of those scales.

Figure 6:
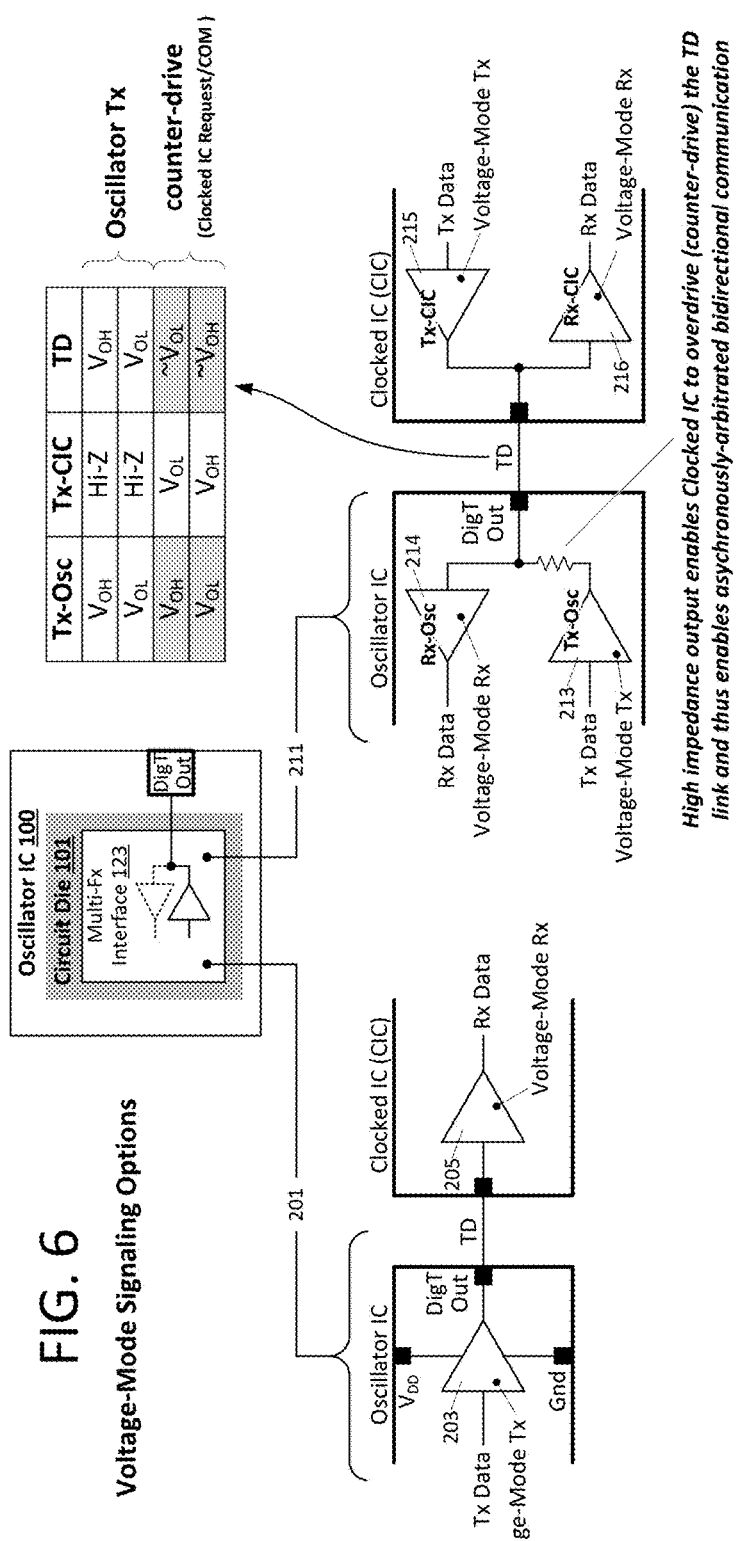
FIG. 6 illustrates various voltage-mode signaling circuits that may be implemented within the multi-function interface within the oscillator IC of FIG. 1.

FIG. 6 illustrates various voltage-mode signaling circuits that may be implemented within the multi-function interface within the oscillator IC of FIG. 1. In one implementation, shown at 201, the multi-function interface implements a signal driver only, providing no facility for signal reception. More specifically, a voltage-mode transmitter 203 is powered by upper and lower supply voltages ($V_{DD}$ and ground in this example) and generates a symbol-encoded (digital) output waveform; generally, a binary-encoded output, though multi-bit symbols may also be generated. Though not specifically shown, bypass capacitors or other filtering circuitry may be coupled between the supply rails to mitigate switching output noise—an approach generally applicable with respect to all signaling circuitry within the oscillator IC and/or other system components powered by common supply rails. In a number of embodiments, the output waveform constitutes an asynchronous transmission (e.g., with payload bits framed within a data unit marked by one or more start and stop bits) to be detected within a voltage-mode receiver 205 within the clocked IC. In other embodiments, timing information may be encoded within the symbol waveform (e.g., as in Manchester encoding) to enable signaling clock (or signaling phase) recovery within the clocked IC so that the symbol waveform may be synchronously sampled within the voltage-mode receiver.

Detail view 211 of FIG. 6 illustrates an alternative implementation of multi-functional interface that includes both a voltage-mode signal driver 213 and a voltage-mode signal receiver 214. In particular, the voltage mode driver is coupled to the DigT Out node via a relatively high output impedance that permits a remote signal driver (i.e., voltage-mode driver 215 within the clocked IC) to overdrive the temperature data line (TD)—in effect overriding the TD line voltage that would otherwise result from the oscillator driver output. While the increased output impedance generally lowers the signaling-rate ceiling (e.g., increasing the RC time-constant of the load seen by oscillator IC output driver 213 and thus decreasing signal slew rate), the link bandwidth remains well above that required for periodic or continuous temperature data reporting (including one-time or as-demanded scaling data transmission). With regard to output voltage levels, while clocked-IC transmitter 215 remains in a high-impedance state (e.g., implemented as a tri-state driver that may drive a high, a low or an open-circuit/high-impedance output), the voltage level output by the oscillator IC signal driver will propagate via the temperature data line to enable counterpart signal reception within voltage-mode receiver 216 of the clocked IC. By contrast, when the clocked IC drives a potential different from that driven by the oscillator IC, a voltage division between the relatively low output impedance of clocked-IC driver 215 and the relatively high output impedance of the oscillator IC driver 213 (e.g., 50Ω and 1 KΩ, respectively, though other impedance levels may apply) permits the clocked-IC driver output to predominate the TD line potential. That is, the TD line potential will predominantly reflect the clocked IC driver output (per the voltage division effected by the disparate output impedances). Accordingly, by sampling the temperature data line (i.e., the voltage level at DigT Out) within voltage-mode receiver 214 of the oscillator IC during signal transmission within the oscillator IC's voltage-mode driver 213 and comparing the sampled voltage against that expected for the transmitted data bit, the oscillator IC may infer (determine) from any mismatch or discrepancy that the clocked IC is simultaneously driving (counter-driving) the temperature data line. Further, in an embodiment where the temperature data line is idled at a predetermined potential (e.g., pulled high when not conveying an information-bearing signal), the oscillator IC may determine that the clocked IC is driving the temperature data line by detecting (via the voltage mode receiver) that the temperature data line has been driven to the opposite (or non-idle) potential. In either case, the oscillator IC may interpret the TD line counter-drive (or idle-time drive) as either a request from the clocked IC for prospective, exclusive signal-drive access with respect to the temperature data line (e.g., for a predetermined or indeterminant interval) or a command or request per se to carry out a predetermined or pre-programmed action. For example, in the case of a request for prospective signal-drive access, the oscillator IC may cease temperature transmission for a predetermined interval or until the clocked IC transmits information indicating TD-line relinquishment and, during that time, receive control information, configuration/programming information, requests for scaling data, updated scaling data, etc. from the clocked IC. Where the counter-drive itself is interpreted as a command or request to carry out a predetermined action, the oscillator IC may respond to the counter-drive detection by outputting scaling data or any other information (e.g., in accordance with a pre-programmed response policy) to the clocked IC.

Figure 7:
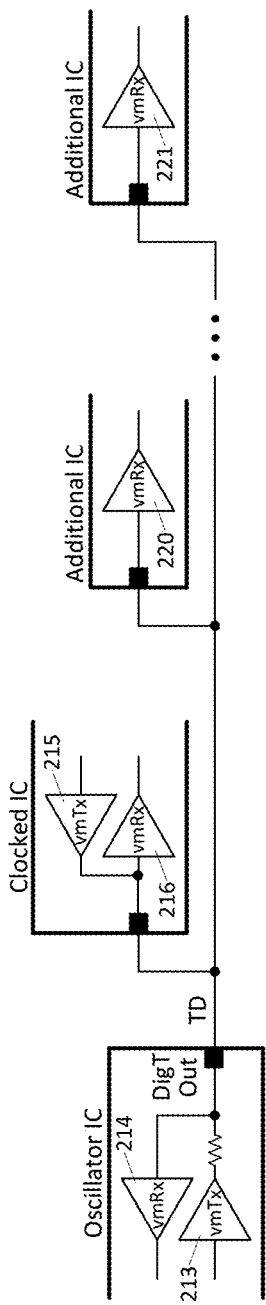
FIG. 7 illustrates a point-to-multi-point system interconnect architecture in which the temperature data line is coupled between the oscillator IC and two or more other ICs, at least one of which is a clocked IC.

FIG. 7 illustrates a point-to-multi-point system interconnect architecture in which the temperature data line (TD) is coupled between the oscillator IC and two or more other ICs, at least one of which is a clocked IC (i.e., also coupled to receive the clock output of the oscillator IC). Though each "additional IC" is depicted as having a TD line receiver only (220, 221), those ICs may additionally include voltage-mode transmitters. In such an arrangement, the oscillator IC or clocked IC may periodically or occasionally issue transmit-authorization tokens to other ICs coupled to the TD link, with the token holder at any point in time having sole output-drive access to the TD line for a predetermined or indeterminate time. Various other signal line arbitration techniques may be employed to convey temporary line-driving access to individual ICs in alternative embodiments.

Figure 8:
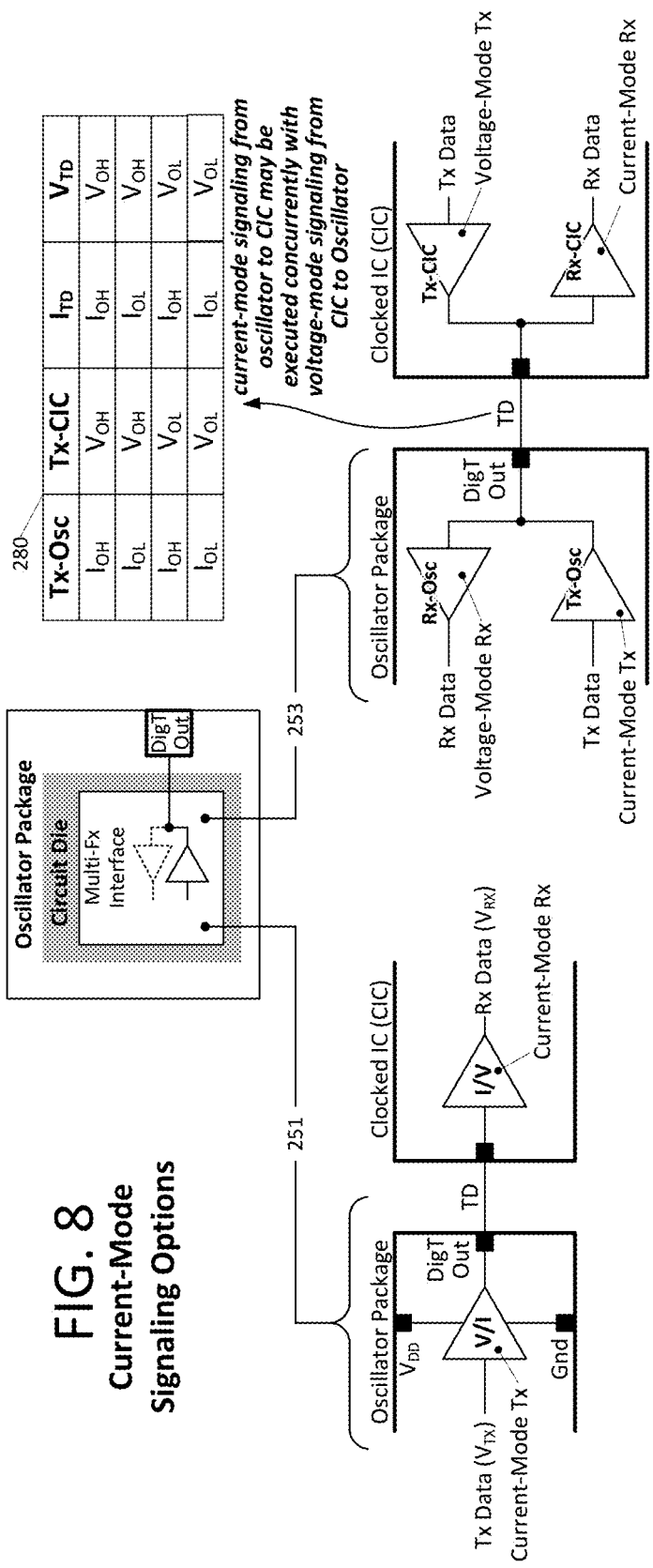
FIG. 8 illustrates various current-mode signaling circuits that may be implemented within the multi-function interface of the oscillator IC.

FIG. 8 illustrates various current-mode signaling circuits that may be implemented within the multi-function interface of the oscillator IC, including a signal-drive only embodiment at 251 and a bidirectional signaling embodiment at 253. In both embodiments, a current-mode transmitter outputs a current-switched symbol-encoded (digital) data signal to be received by a current-mode receiver, for example, a binary signal in which a first current corresponds to a logic '1' and a second current corresponds to a logic '0' (the first and second currents may be disparate in amplitude, sign or both, and either the first current or the second may be zero). In general, the current-mode transmitter is implemented with extremely low or negligible output impedance and the current-mode receiver is implemented with correspondingly low input impedance so that transition between the first and second current levels imparts little or no change in TD line voltage—switching noise is virtually eliminated yielding a near ideal high-precision timing environment.

In a number of embodiments, the current-mode transmitter and receiver circuits shown in FIG. 8 are implemented by a transconductance amplifier (TCA) and transimpedance amplifier (TIA), respectively. In one implementation, for example, the TCA sources or sinks current in accordance with transmit data signal $V_{TX}$—sourcing current when $V_{TX}$ is low and sinking current when $V_{TX}$ is high and thus performing a voltage to current conversion. The TIA maintains the signaling link at a steady-state voltage (e.g., $V_{DD}/2$), sourcing or sinking current to/from the signaling link to match the current source/sink within the TCA/transmitter and thereby recovering a voltage waveform ($V_{RX}$—a received data signal) corresponding to the transmit data signal. Various other current-mode signaling arrangements may be implemented in alternative embodiments, including single-flow-direction embodiments in which current flows in a single direction (to or from the transmitter) at two different levels to convey logic symbols (i.e., no change in current direction), capacitively coupled embodiments and so forth.

Still referring to FIG. 8, in the bidirectional signaling embodiment at 253 the current-mode transmitter/receiver arrangement is supplemented by a reverse-direction voltage-mode transmitter/receiver pair—an arrangement that permits voltage mode transmission from the clocked IC to the oscillator IC concurrently with (i.e., over the top of) current-mode transmission from the oscillator IC to the clocked IC. Exemplary current and voltage outputs from the oscillator IC and clocked IC are shown in table 280 together with corresponding current and voltage levels on the temperature data line ($I_{TD}$, $V_{TD}$). The $I_{OH}$ and $I_{OL}$ values shown in table 280 refer to high and low current levels, respectively, and the $V_{OH}$ and $V_{OL}$ values refer to high and low voltage levels.

FIG. 9 illustrates an exemplary packetized data protocol that may be used to communicate data in either direction over the temperature data line (e.g., temperature and/or scaling data from oscillator IC to clocked IC, programming information, commands or other information from clocked IC to oscillator IC). With respect to physical organization, data is arranged within start-bit/stop-bit delineated data frames, with a sequence of data frames (e.g., a predetermined number of data frames) constituting a data packet. Data packets themselves may be transmitted continuously or discontinuously (e.g., intervening idle periods) and logically organized to include, for example a preamble field, source and/or destination device address field, packet type field, byte count field and payload data byte fields. Exemplary physical and logical lengths of those bitfields are shown on the assumption of 10 physical bits per 8 logical bits (i.e., 10 bit data frame with a single start bit and a single stop bit to frame 8 data bits); other physical/logical bit ratios may apply in alternative protocols. In general, the preamble field is used to mark the beginning of a packet (a postamble field may also be provided), the device address field is used to identify the source and/or destination of a given packet (and thus may be omitted in a point-to-point signaling implementation), the packet type field indicates, for example, the nature of the payload data (e.g., scaling data, temperature data, programming data, etc.) and/or convey a packet sequence number (e.g., where the packet is part of a larger data construct), and the data fields collectively form the packet payload. Alternative field sizes, field arrangements and types of fields may be used in alternative signaling protocols. More generally, temperature data, scaling data and/or inbound control signals may be communicated via any standardized signaling protocol (e.g., SPI (Serial Peripheral Interface), I²C (Inter-Integrated Circuit), etc.) or proprietary signaling protocol.

FIG. 10 illustrates an exemplary counter-drive detection protocol that may be implemented within an oscillator IC (e.g., the "Control" element with CMOS die 103 of FIG. 1) in the context of a packetized communication stream. At start of packet transmission, the oscillator IC initializes a data frame index ("i=0") and then commences packet transmission, transmitting a given data frame at 301 and evaluating the TD line state at 303 as each bit is transmitted to detect possible counter-drive from the clocked IC. More specifically, as shown in detail view of data frame transmission at 320, the oscillator IC transmits a start bit and then loops for the remaining data-frame bits, driving the TD line according to the bit-state ('1' or '0') to be conveyed and sampling the TD line during bit-drive. Mismatch between the sampled TD state ("RxD") and transmitted bit state (i.e., RxD< >TxD—a comparison executed within the multi-function interface or control circuitry of the oscillator IC) is interpreted as a counter-drive detection at 3-3. As shown, affirmative counter-drive detection is communicated to the control logic at 305 and the packet transmission is aborted. Otherwise, if a given data frame is transmitted without counter-drive detection, the data frame index is incremented at 307 and the data-frame transmission loop is repeated—loop iteration that continues until the final data frame in the packet has been transmitted (affirmative determination at 309).

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific communication protocols, interconnect topologies, sensor implementations, component elements and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Device configuration or programming can include, for example and without limitation, loading a control value into a register or other storage circuit within an integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit device comprising:
   a microelectromechanical-system (MEMS) resonator;
   circuitry to generate a clock signal at least in part by sensing resonant mechanical motion of the MEMS resonator;
   circuitry to measure a temperature; and
   circuitry to output from the integrated circuit device the clock signal and digital information representing the measured temperature;
   wherein the circuitry to output comprises a first electrical pin to output the clock signal as a first signal and a second electrical pin to output the digital information representing the measured temperature as a second signal;
   wherein the circuitry to output is also to output information representing a temperature-dependent frequency error of the clock signal; and
   wherein the circuitry to output comprises a multifunction interface that is to output each of the information representing the temperature-dependent frequency error and the digital information representing the measured temperature via a common electrical pin.

2. The integrated circuit device of claim 1, wherein the circuitry to output is to output the digital information as values at respective temperature measurement update times, the values representing respective temperature measurements, using an asynchronous communication protocol.

3. The integrated circuit device of claim 1, wherein the circuitry to output is to output the digital information representing the measured temperature in a packet-based format, wherein the packet-based format comprises a set of bits.

4. The integrated circuit device of claim 3, wherein the circuitry to output comprises an output driver that is to transmit the bits of the set, in a manner timed dependent on the mechanical motion of the MEMS resonator.

5. The integrated circuit device of claim 1, wherein the circuitry to output is to output the information representing the temperature-dependent frequency error in the form of polynomial coefficients which correspond to variation in frequency of the clock signal as a function of temperature encountered by the MEMS resonator.

6. The integrated circuit device of claim 1, wherein the circuitry to output is to output the information representing the temperature-dependent frequency error in the form of one or more frequency offsets.

7. The integrated circuit device of claim 1, wherein the circuitry to output is to output the information representing the temperature-dependent frequency error autonomously, as a repeating signal.

8. The integrated circuit device of claim 1, wherein the circuitry to output is to output the information representing the temperature-dependent frequency error in response to an external prompt.

9. The integrated circuit device of claim 1, wherein:
   the integrated circuit device comprises a first die and a second die;
   the MEMS resonator is carried by the first die;
   the second die comprises said circuitry to output; and
   the first die is mounted in thermal communication with the second die.

10. The integrated circuit device of claim 1, wherein the digital information representing the measured temperature is dependent on the mechanical motion of the MEMS resonator.

11. An integrated circuit device comprising:
    a microelectromechanical-system (MEMS) resonator;
    circuitry to generate a clock signal at least in part by sensing resonant mechanical motion of the MEMS resonator;
    circuitry to measure a temperature; and
    circuitry to output from the integrated circuit device the clock signal and digital information representing the measured temperature;
    wherein the circuitry to output comprises a first electrical pin to output the clock signal as a first signal and a second electrical pin to output the digital information representing the measured temperature as a second signal;
    wherein the circuitry to output is also to output information representing a temperature-dependent frequency error of the clock signal; and
    wherein the circuitry to output comprises a bidirectional signaling interface that is to output the information representing the temperature-dependent frequency error and that is also to receive a command to program at least one value in the integrated circuit device, via a common electrical pin, the command being transmitted from an external, clocked integrated circuit.

12. An integrated circuit device comprising:
    a microelectromechanical-system (MEMS) resonator;
    circuitry to generate a clock signal at least in part by sensing resonant mechanical motion of the MEMS resonator;
    circuitry to measure a temperature; and
    circuitry to output from the integrated circuit device the clock signal and digital information representing the measured temperature;
    wherein the circuitry to output comprises a first electrical pin to output the clock signal as a first signal and a second electrical pin to output the digital information representing the measured temperature as a second signal;

wherein the circuitry to output is also to output information representing a temperature-dependent frequency error of the clock signal; and wherein the circuitry to output comprises a bidirectional signaling interface that is to output the digital information representing the measured temperature and that is also to receive a command to program at least one value into the integrated circuit device, via a common electrical pin, the command being transmitted from an external, clocked integrated circuit.

13. An apparatus, comprising:
an integrated circuit device having
a microelectromechanical-system (MEMS) resonator,
circuitry to generate a clock signal at least in part by sensing resonant mechanical motion of the MEMS resonator,
circuitry to measure a temperature, and
circuitry to output from the integrated circuit device the clock signal and digital information representing the measured temperature,
wherein
the circuitry to output comprises a first electrical pin to output the clock signal as a first signal and a second electrical pin to output the digital information representing the measured temperature as a second signal,
the circuitry to output is also to output information representing a temperature-dependent frequency error of the clock signal, and
the circuitry to output comprises a multifunction interface that is to output each of the information representing the temperature-dependent frequency error and the digital information representing the measured temperature via a common electrical pin; and
a clocked integrated circuit to receive the clock signal from the integrated circuit device and to receive the digital information representing the measured temperature and the information representing the temperature-dependent frequency error.

14. The apparatus of claim 13, wherein the clocked integrated circuit comprises circuitry to provide temperature-dependent frequency correction to timing conveyed by the clock signal in dependence on the digital information representing the measured temperature and in dependence on the temperature-dependent frequency error.

15. The apparatus of claim 13, wherein the circuitry to output is to output the digital information representing the measured temperature in a packet-based format, wherein the packet-based format comprises a set of bits, and wherein the circuitry to output comprises an output driver that is to transmit the bits of the set, in a manner timed dependent on the mechanical motion of the MEMS resonator.

16. The apparatus of claim 13, wherein the circuitry to output is to output the information representing the temperature-dependent frequency error in the form of polynomial coefficients which correspond to variation in frequency of the clock signal as a function of temperature encountered by the MEMS resonator.

17. The apparatus of claim 13, wherein the circuitry to output is to output the information representing the temperature-dependent frequency error in response to an external prompt.

18. The apparatus of claim 13, wherein:
the integrated circuit device comprises a first die and a second die;
the MEMS resonator is carried by the first die;
the second die comprises said circuitry to output; and
the first die is mounted in thermal communication with the second die.

19. The apparatus of claim 13, wherein the digital information representing the measured temperature is dependent on the mechanical motion of the MEMS resonator.

20. An apparatus, comprising:
an integrated circuit device having
a microelectromechanical-system (MEMS) resonator,
circuitry to generate a clock signal at least in part by sensing resonant mechanical motion of the MEMS resonator,
circuitry to measure a temperature, and
circuitry to output from the integrated circuit device the clock signal and digital information representing the measured temperature,
wherein
the circuitry to output comprises a first electrical pin to output the clock signal as a first signal and a second electrical pin to output the digital information representing the measured temperature as a second signal,
the circuitry to output is also to output information representing a temperature-dependent frequency error of the clock signal, and
the circuitry to output is to output digital values representing the measured temperature at respective temperature measurement update times, using an asynchronous communication protocol, wherein the asynchronous communication protocol comprises a frame-based format having a start character and an end character, and wherein the clocked integrated circuit is to identify the frame from the start character and the end character and recover measured temperature from the frame-based format; and
a clocked integrated circuit to receive the clock signal from the integrated circuit device and to receive the digital information representing the measured temperature and the information representing the temperature-dependent frequency error.

21. An apparatus, comprising:
an integrated circuit device having
a microelectromechanical-system (MEMS) resonator,
circuitry to generate a clock signal at least in part by sensing resonant mechanical motion of the MEMS resonator,
circuitry to measure a temperature, and
circuitry to output from the integrated circuit device the clock signal and digital information representing the measured temperature,
wherein
the circuitry to output comprises a first electrical pin to output the clock signal as a first signal and a second electrical pin to output the digital information representing the measured temperature as a second signal,
the circuitry to output is also to output information representing a temperature-dependent frequency error of the clock signal, and
the circuitry to output comprises a bidirectional signaling interface that is to output the information representing the temperature-dependent frequency error and that is also to receive a command to program at least one value in the integrated circuit device, via a common electrical pin, the command being transmitted from the clocked integrated circuit; and a clocked integrated circuit to receive the clock signal from the integrated circuit device and to receive the digital information representing the measured temperature and the information representing the temperature-dependent frequency error.

22. An apparatus, comprising:
an integrated circuit device having
   a microelectromechanical-system (MEMS) resonator,
   circuitry to generate a clock signal at least in part by sensing resonant mechanical motion of the MEMS resonator,
   circuitry to measure a temperature, and
   circuitry to output from the integrated circuit device the clock signal and digital information representing the measured temperature,
   wherein
      the circuitry to output comprises a first electrical pin to output the clock signal as a first signal and a second electrical pin to output the digital information representing the measured temperature as a second signal,
      the circuitry to output is also to output information representing a temperature-dependent frequency error of the clock signal, and
      the circuitry to output comprises a bidirectional signaling interface that is to output the digital information representing measured temperature and that is also to receive a command to program at least one value into the integrated circuit device, via a common electrical pin, the command being transmitted from the clocked integrated circuit; and
a clocked integrated circuit to receive the clock signal from the integrated circuit device and to receive the digital information representing the measured temperature and the information representing the temperature-dependent frequency error.

23. An apparatus, comprising:
an integrated circuit device having
   a microelectromechanical-system (MEMS) resonator,
   circuitry to generate a clock signal at least in part by sensing resonant mechanical motion of the MEMS resonator,
   circuitry to measure a temperature, and
   circuitry to output from the integrated circuit device the clock signal and digital information representing the measured temperature,
   wherein
      the circuitry to output comprises a first electrical pin to output the clock signal as a first signal and a second electrical pin to output the digital information representing the measured temperature as a second signal,
      the circuitry to output is also to output information representing a temperature-dependent frequency error of the clock signal, and
      the first electrical pin is to transfer the clock signal in a one-way direction, from the integrated circuit device to the clocked integrated circuit, and wherein the second electrical pin is to bidirectionally exchange digital control information pertaining to the clock signal; and
a clocked integrated circuit to receive the clock signal from the integrated circuit device and to receive the digital information representing the measured temperature and the information representing the temperature-dependent frequency error.

24. A method of operation in a signaling system having an integrated circuit device that is to generate a clock signal and a clocked integrated circuit that is to receive the clock signal from the integrated circuit device, the method comprising:
   with circuitry of the integrated circuit device, generating the clock signal in the integrated circuit device at least in part by sensing resonant mechanical motion of a MEMS resonator carried by the integrated circuit device, measuring a temperature, and outputting from the integrated circuit device the clock signal via a first electrical pin as a first signal and digital information representing the measured temperature via a second electrical pin as a second signal, wherein the method further comprises also outputting information representing a temperature-dependent frequency error of the clock signal; and
   with circuitry of the clocked integrated circuit, receiving the clock signal, the digital information representing the measured temperature and the information representing the temperature-dependent frequency error from the integrated circuit device, and using the information representing the measured temperature and the information representing the temperature-dependent frequency error to compensate for temperature-dependent variation of frequency in the clock signal;
   wherein the method further comprises, with the circuitry of the integrated circuit device, outputting the digital information representing measured temperature and the information representing the temperature-dependent frequency error via a common electrical pin of the integrated circuit device.

25. The method of claim 24, wherein the method further comprises outing the information representing the temperature-dependent frequency error in the form of polynomial coefficients which correspond to variation in frequency of the clock signal as a function of temperature encountered by the MEMS resonator.

* * * * *